(12) United States Patent
Kim et al.

(10) Patent No.: US 10,763,398 B2
(45) Date of Patent: Sep. 1, 2020

(54) LIGHT EMITTING DEVICE PACKAGE

(71) Applicant: LG INNOTEK CO., LTD., Seoul (KR)

(72) Inventors: Wong Jung Kim, Seoul (KR); June O Song, Seoul (KR); Ki Seok Kim, Seoul (KR); Chang Man Lim, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 0 days.

(21) Appl. No.: 16/238,046

(22) Filed: Jan. 2, 2019

(65) Prior Publication Data
US 2019/0207062 A1    Jul. 4, 2019

(30) Foreign Application Priority Data
Jan. 3, 2018    (KR) .................... 10-2018-0000506

(51) Int. Cl.
| | | |
|---|---|---|
| H01L 33/00 | (2010.01) | |
| H01L 33/48 | (2010.01) | |
| H01L 33/56 | (2010.01) | |
| H01L 33/60 | (2010.01) | |
| H01L 33/62 | (2010.01) | |
| H01L 33/50 | (2010.01) | |

(52) U.S. Cl.
CPC ............ *H01L 33/486* (2013.01); *H01L 33/56* (2013.01); *H01L 33/60* (2013.01); *H01L 33/62* (2013.01); *H01L 33/507* (2013.01); *H01L 2933/0033* (2013.01)

(58) Field of Classification Search
USPC ............... 257/81, 82, 91, 99, 100, 116, 117, 257/432–437, 749, E33.056–E33.059, 257/E25.032; 438/25–28
See application file for complete search history.

(56) References Cited

U.S. PATENT DOCUMENTS

| | | | | |
|---|---|---|---|---|
| 9,179,543 | B2* | 11/2015 | Palaniswamy | ........ H01L 33/486 |
| 2010/0059807 | A1* | 3/2010 | Cho | ................... H01L 27/10814 |
| | | | | 257/306 |
| 2011/0284882 | A1 | 11/2011 | An | |
| 2014/0332839 | A1* | 11/2014 | Choi | ........................ H01L 33/62 |
| | | | | 257/99 |
| 2015/0054001 | A1* | 2/2015 | Oganesian | ........... H04N 5/2258 |
| | | | | 257/82 |
| 2016/0056356 | A1* | 2/2016 | Oh | ........................ H01L 33/60 |
| | | | | 257/98 |

(Continued)

FOREIGN PATENT DOCUMENTS

| | | |
|---|---|---|
| KR | 10-0705241 B1 | 4/2007 |
| KR | 10-2011-0128006 A | 11/2011 |
| KR | 10-2015-0017920 A | 2/2015 |

*Primary Examiner* — Niki H Nguyen
(74) *Attorney, Agent, or Firm* — Birch, Stewart, Kolasch & Birch, LLP

(57) ABSTRACT

A light emitting device package according to an embodiment includes: a body including an upper surface, a lower surface, and a side surface connecting the upper surface and the lower surface, and first and second openings passing through the upper surface and the lower surface; and a light emitting device including first and second bonding portions disposed on the first and second openings, respectively, wherein the body may include a recess provided on the lower surface, the recess may be vertically overlapped with the first opening and the second opening, and the recess may be exposed at the side surface of the body.

20 Claims, 7 Drawing Sheets

(56) References Cited

U.S. PATENT DOCUMENTS

| | | | |
|---|---|---|---|
| 2016/0204090 A1* | 7/2016 | Lu | H01L 33/507 |
| | | | 257/98 |
| 2017/0244012 A1* | 8/2017 | Choi | H01L 33/52 |
| 2017/0358716 A1* | 12/2017 | Park | H01L 33/60 |
| 2019/0019929 A1* | 1/2019 | Lim | H01L 33/56 |
| 2019/0027641 A1* | 1/2019 | Lee | H01L 33/62 |

* cited by examiner

LIGHT EMITTING DEVICE PACKAGE

CROSS-REFERENCE TO RELATED APPLICATIONS

This application claims priority under 35 U.S.C. § 119 to Korean Patent Application No. 10-2018-0000506 filed in Korea on Jan. 3, 2018 which is hereby incorporated in its entirety by reference as if fully set forth herein.

TECHNICAL FIELD

The embodiment relates to a semiconductor device package, a method of manufacturing the semiconductor device package, and a light source apparatus.

BACKGROUND

A semiconductor device including compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using group III-V or group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using group III-V or group II-VI compound semiconductor substances can implement a white light source having high efficiency by using fluorescent substances or combining colors. Such a light emitting device has advantages such as low power consumption, semi-permanent lifetime, quick response speed, safety, and environmental friendliness compared to conventional light sources such as fluorescent lamps and incandescent lamps.

In addition, when a light receiving device such as a photodetector or a solar cell is manufactured using the group III-V or group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness and easy control of device materials, so that the light receiving device can be easily used for a power control, a super-high frequency circuit or a communication module.

Accordingly, the semiconductor device has been applied and expanded to a transmission module of an optical communication tool, a light emitting diode backlight replacing a cold cathode fluorescent lamp (CCFL) constituting a backlight of a liquid crystal display (LCD), a white light emitting diode lighting apparatus replaceable with a fluorescent lamp or an incandescent bulb, a vehicular headlight, a traffic light and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

For example, since a nitride semiconductor has high thermal stability and wide bandgap energy, it has received great attention in the field of development of optical devices and high power electronic devices. Particularly, a blue light emitting device, a green light emitting device, an ultraviolet (UV) light emitting device, and a red light emitting device using the nitride semiconductor are commercialized and widely used.

For example, the ultraviolet light emitting device refers to a light emitting diode that generates light distributed in a wavelength range of 200 nm to 400 nm. In the above wavelength range, a short wavelength may be used for sterilization, purification or the like and a long wavelength may be used for a stepper, a curing apparatus or the like.

Ultraviolet rays may be classified into UV-A (315 nm to 400 nm), UV-B (280 nm to 315 nm) and UV-C (200 nm to 280 nm) in an order of the long wavelength. The UV-A (315 nm to 400 nm) domain is applied to various fields such as industrial UV curing, curing of printing ink, exposure machine, discrimination of counterfeit money, photocatalytic sterilization, special lighting (such as aquarium/agriculture), the UV-B (280 nm to 315 nm) domain is applied to medical use, and the UV-C (200 nm to 280 nm) domain is applied to air purification, water purification, sterilization products and the like.

Meanwhile, as a semiconductor device capable of providing a high output has been requested, studied on a semiconductor device capable of increasing an output power by applying a high power source has been proceeding.

In addition, as for a semiconductor device package, studies on a method of improving the light extraction efficiency of a semiconductor device and improving the light intensity in a package stage has been proceeding. In addition, as for the semiconductor device package, studies on a method of improving bonding strength between a package electrode and a semiconductor device has been proceeding.

In addition, as for the semiconductor device package, studies on a method of reducing the manufacturing cost and improving the manufacturing yield by improving the process efficiency and changing the structure has been proceeding.

SUMMARY

The embodiments may provide a semiconductor device package capable of improving the light extraction efficiency and electrical characteristics, a method of manufacturing the semiconductor device package, and a light source apparatus.

The embodiments may provide a semiconductor device package capable of reducing the manufacturing cost and improving the manufacturing yield, a method of manufacturing the semiconductor device package, and a light source apparatus.

The embodiments may provide a semiconductor device package and a method of manufacturing a semiconductor device package that may prevent a re-melting phenomenon from occurring in a bonding region of the semiconductor device package during a process of re-bonding the semiconductor device package to a substrate or the like.

A light emitting device package according to an embodiment includes: a body including an upper surface, a lower surface, a side surface connecting the upper surface and the lower surface, and first and second openings passing through the upper surface and the lower surface; and a light emitting device including first and second bonding portions disposed on the first and second openings, respectively, wherein the body may include a recess provided on the lower surface, wherein the recess may be vertically overlapped with the first opening and wherein the second opening, and the recess may be exposed at the side surface of the body.

According to the embodiment, the side surface of the body may include a first side surface and a second side surface facing each other, and the recess may pass through the first side surface and the second side surface.

According to the embodiment, the side surface of the body may have at least two exposed portions spaced apart from each other at the first side surface.

According to the embodiment, the recess may include a first recess extended in the same direction as a first direction from the first bonding portion of the light emitting device toward the second bonding portion of the light emitting device and a second recess extended in a second direction perpendicular to the first direction.

According to the embodiment, the body may include a first portion and a second portion, wherein the second portion may be disposed under the light emitting device to provide the first and second openings, wherein the first portion may be provided around the second portion, wherein a thickness of the second portion may be provided smaller than that of the first portion, wherein a lower surface of the first portion and a lower surface of the second portion may be provided to be stepped to each other, and wherein the lower surface of the second portion may be disposed higher than the lower surface of the first portion.

The light emitting device package according to the embodiment may further include: a first resin disposed between the body and the light emitting device; and an upper recess provided on an upper surface of the second portion, and the first resin may be disposed at the upper recess.

According to the embodiment, the upper recess may include first and second upper recesses, and the first upper recess may be provided around the first opening, and the second upper recess may be provided around the second opening.

According to the embodiment, the upper recess may further include a third upper recess, and the third upper recess may be disposed on an upper surface between the first opening and the second opening.

According to the embodiment, the first and second bonding portions may be overlapped with the first and second openings in a third direction, wherein the third direction may be perpendicular to the first direction and the second direction and may be a direction from the lower surface of the body toward the upper surface of the body.

According to the embodiment, areas of lower surfaces of the first and second bonding portions may be provided to be larger than areas of upper regions of the first and second openings, respectively.

The light emitting device package according to the embodiment may include a conductor disposed in the first and second openings and electrically connected to the first and second bonding portions, respectively.

The light emitting device package according to the embodiment may include a circuit board disposed under the lower surface of the body, and the lower surface of the second portion of the body may be disposed to be spaced apart from an upper surface of the circuit board to provide a space.

A light emitting device package according to an embodiment includes: a body including an upper surface, a lower surface, and a side surface connecting the upper surface and the lower surface, and first and second openings passing through the lower surface from the upper surface; and a light emitting device including a first bonding portion disposed on the first opening and a second bonding portion disposed on the second opening, wherein the body may include a recess provided on the lower surface, and wherein the recess may be provided by passing through a first side surface and a second side surface facing each other among the side surfaces of the body.

According to the embodiment, the recess may be disposed on the lower surface of the body, and include a plurality of regions disposed to concave in a direction of the upper surface thereof from the lower surface of the body, and at least two regions among the plurality of regions may be provided to be in connection with each other.

According to the embodiment, the recess may include a first lower recess passing through the first side surface and the second side surface and a second lower recess passing through the first side surface and the second side surface, and the first lower recess and the second lower recess may be disposed to be spaced apart from the first side surface and the second side surface.

According to the embodiment, the first lower recess may be provided to be exposed to the first side surface and the second side surface, and the second lower recess may be disposed to be exposed to the first side surface and the second side surface.

According to the embodiment, the recess may include a first recess extended in the same direction as a first direction from the first bonding portion of the light emitting device toward the second bonding portion thereof and a second recess extended in a second direction perpendicular to the first direction.

According to the embodiment, the recess may be provided at a periphery of the first and second openings.

The light emitting device package according to the embodiment may include a conductor disposed in the first and second openings and electrically connected to the first and second bonding portions, respectively.

The light emitting device package according to the embodiment may include a circuit board disposed under the lower surface of the body, and a portion of the lower surface of the body may be disposed to be spaced apart from an upper surface of the circuit board.

Advantageous Effects

The semiconductor device package and the method of manufacturing the semiconductor device package according to the embodiment can improve light extraction efficiency, electrical characteristics and reliability.

The semiconductor device package and the method of manufacturing the semiconductor device package according to the embodiment can improve the process efficiency and propose a new package structure, thereby reducing manufacturing cost and improving manufacturing yield.

According to embodiments, the semiconductor device package is provided with a body having high reflectance, so that a reflector can be prevented from being discolored, thereby improving reliability of the semiconductor device package.

According to embodiments, the semiconductor device package and the method of manufacturing a semiconductor device can prevent a re-melting phenomenon from occurring in a bonding region of the semiconductor device package during a process of re-bonding the semiconductor device package to a substrate or the like or heat-treating the semiconductor device package.

DETAILED DESCRIPTION OF THE EMBODIMENTS

Hereinafter, embodiments will be described with reference to the accompanying drawings. In the description of embodiments, it will be understood that when a layer (or film), region, pattern or structure is referred to as being "on" or "under" another layer (or film), region, pattern or structure, the terminology of "on" and "under" includes both the meanings of "directly" or "by interposing another layer (indirectly)". Further, the reference about "on" and "under" each layer will be made on the basis of drawings, but embodiments are not limited thereto.

Hereinafter, a semiconductor device package according to embodiments of the present invention and a method of manufacturing a semiconductor device package will be described in detail with reference to the accompanying drawings. Hereinafter, it will be described based on the case in which a light emitting device is applied as an example of a semiconductor device.

First, a light emitting device package according to an embodiment of the present invention will be described with reference to FIGS. 1 to 4.

Figure 1:
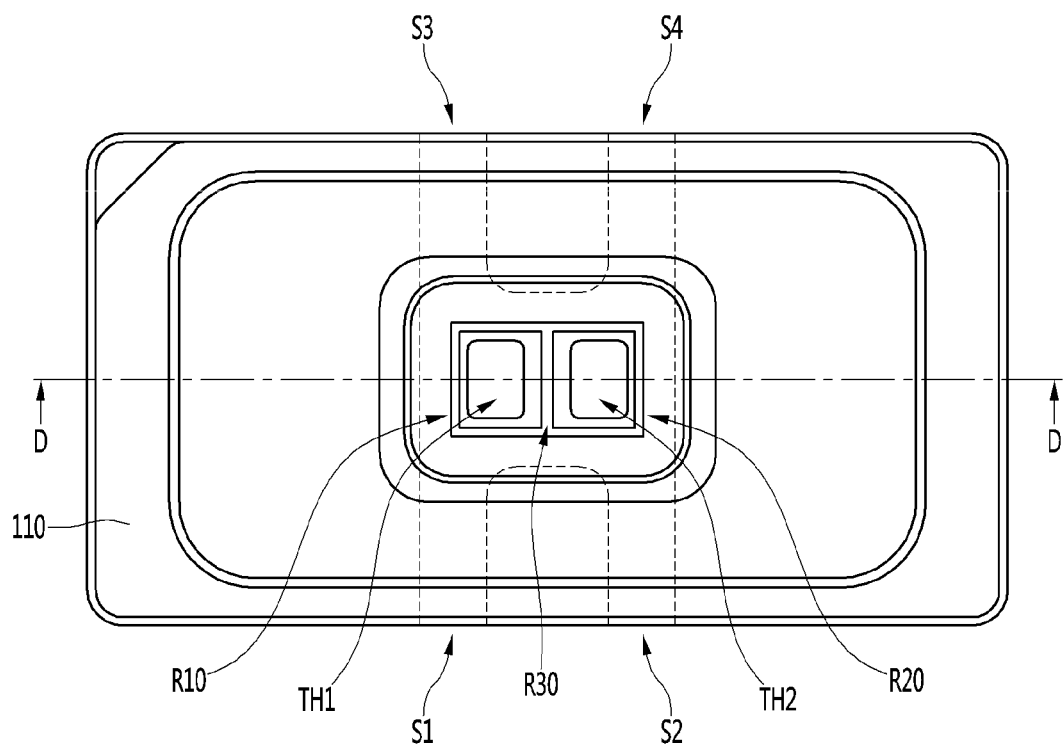
FIG. 1 is a plan view illustrating a light emitting device package according to an embodiment of the present invention.
Figure 3:
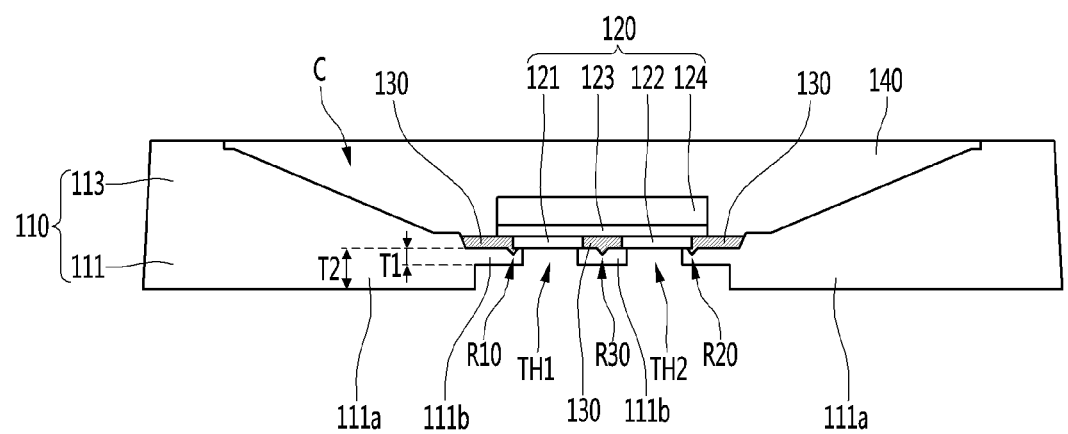
FIG. 3 is a cross-sectional view taken along line D-D of the light emitting device package shown in FIG. 1.
Figure 4:
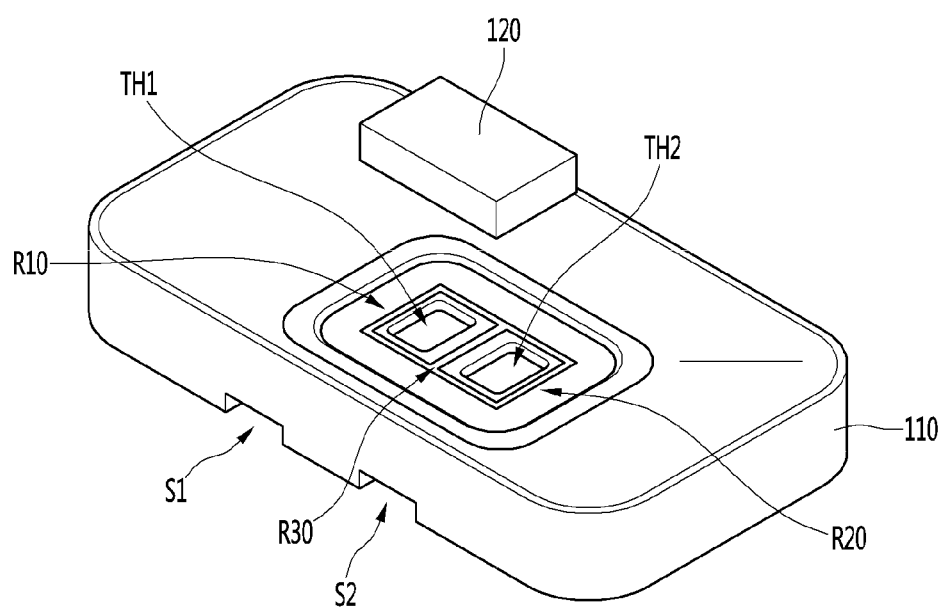
FIG. 4 is an exploded perspective view explaining the light emitting device package shown in FIG. 1.

FIG. 1 illustrates a state in which a light emitting device 120 is not mounted such that a structure of a light emitting device package 100 according to an embodiment may be easily confirmed, and FIGS. 3 and 4 illustrate the arrangement relationship between a body 110 and the light emitting device 120.

The light emitting device package 100 according to the embodiment may include the body 110 and the light emitting device 120, as shown in FIGS. 1 to 4.

The body 110 may include a first body 111 and a second body 113. The second body 113 may be disposed on the first body 111. The second body 113 may be disposed at a periphery of an upper surface of the first body 111. The second body 113 may provide a cavity C on the upper surface of the first body 111.

In other words, the first body 111 may be referred to as a lower body, and the second body 113 may be referred to as an upper body.

The second body 113 may reflect light emitted from the light emitting device 120 in an upper direction. The second body 113 may be disposed to be inclined with respect to the upper surface of the first body 111.

The body 110 may include the cavity C. The cavity C may include a bottom surface and a side surface inclined to an upper surface of the body 110 from the bottom surface.

The first body 111 may include a first portion 111a, a second portion 111b, and a third portion 111c. The first body 111 may include portions having different thicknesses.

For example, the first portion 111a may be provided with a second thickness T2, and the second portion 111b may be provided with a first thickness T1. In addition, the third portion 111c may be provided with a thickness range between the thickness of the first portion 111a and the thickness of the second portion 111b.

The first body 111 may include a stepped region provided by a difference in thickness between the first portion 111a and the second portion 111b. A lower surface of the second portion 111b may be disposed to be higher than a lower surface of the first portion 111a.

The effect of the stepped region of the light emitting device package according to the embodiment will be described later.

For example, the body 110 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 110 may include a high refractive index filler such as $TiO_2$ or $SiO_2$.

According to the embodiment, the light emitting device 120 may include a first bonding portion 121, a second bonding portion 122, a light emitting structure 123, and a substrate 124.

The light emitting structure 123 may include a first conductive type semiconductor layer, a second conductive type semiconductor layer, and an active layer disposed between the first conductive type semiconductor layer and the second conductive type semiconductor layer. The first bonding portion 121 may be electrically connected to the first conductive type semiconductor layer. In addition, the second bonding portion 122 may be electrically connected to the second conductive type semiconductor layer.

The light emitting device 120 may be disposed on the body 110. The light emitting device 120 may be disposed on the first body 111. The light emitting device 120 may be disposed in the cavity C provided by the second body 113.

The first bonding portion 121 may be disposed on a lower surface of the light emitting device 120. The second bonding portion 122 may be disposed on the lower surface of the light emitting device 120. The first bonding portion 121 and the second bonding portion 122 may be disposed to be spaced apart from each other on the lower surface of the light emitting device 120.

The first bonding portion 121 may be disposed between the light emitting structure 123 and the first body 111. The second bonding portion 122 may be disposed between the light emitting structure 123 and the first body 111.

The first bonding portion 121 and the second bonding portion 122 may be formed in a single layer or multiple layers by using at least one material selected from the group consisting of Ti, Al, Sn, In, Ir, Ta, Pd, Co, Cr, Mg, Zn, Ni, Si, Ge, Ag, Ag alloy, Au, Hf, Pt, Ru, Rh, Sn, Cu, ZnO, IrOx, RuOx, NiO, RuOx/ITO, and Ni/IrOx/Au, Ni/IrOx/Au/ITO, or an alloy thereof.

Figure 2:
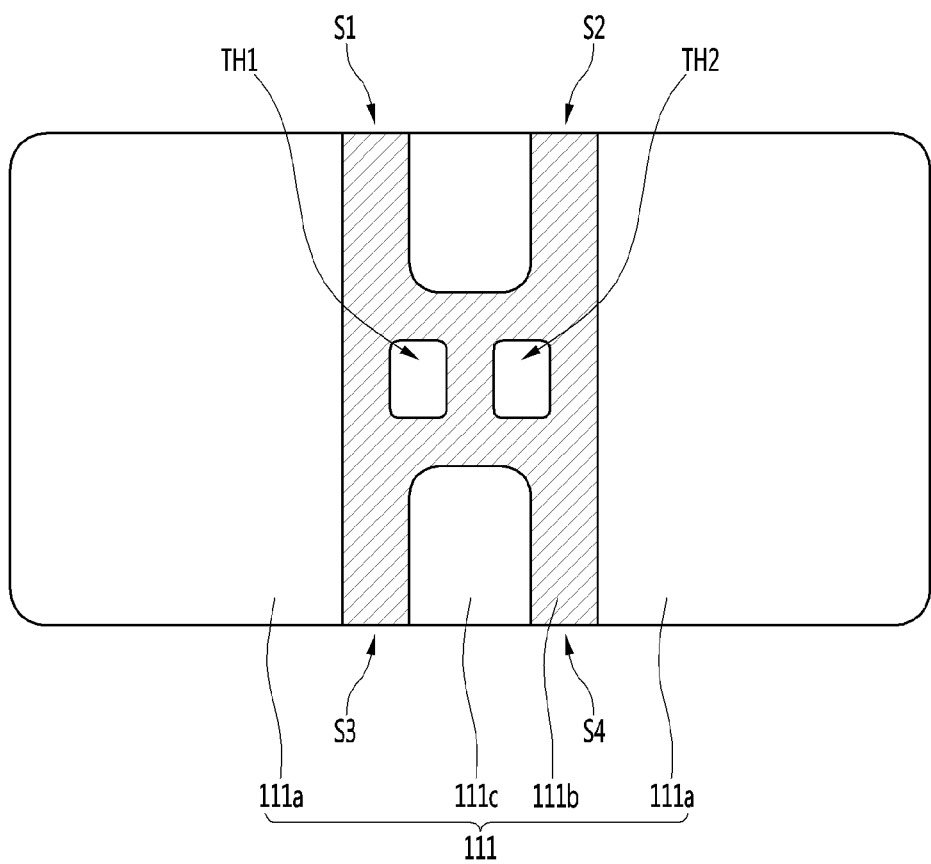
FIG. 2 is a bottom view of the light emitting device package shown in FIG. 1.

The light emitting device package 100 according to the embodiment may include a first opening TH1 and a second opening TH2, as shown in FIGS. 1 and 2.

For example, the first and second openings TH1 and TH2 may be provided by the second portion 111b of the first body 111. In addition, the first portion 111a of the first body 111 may be provided around the second portion 111b.

The body 110 may include the first opening TH1 passing through a lower surface of the body 110 from the bottom surface of the cavity C. The body 110 may include the second opening TH2 passing through the lower surface of the body 110 from the bottom surface of the cavity C.

The first opening TH1 may be provided at the first body 111. The first opening TH1 may be provided by passing through the first body 111. The first opening TH1 may be provided by passing through the upper surface and a lower surface of the first body 111 in a first direction.

The first opening TH1 may be provided at the second portion 111b of the first body 111. The first opening TH1 may be provided by passing through the second portion 111b. The first opening TH1 may be provided by passing through an upper surface and the lower surface of the second portion 111b in the first direction.

The first opening TH1 may be disposed under the light emitting device 120. The first opening TH1 may be provided to be overlapped with the first bonding portion 121 of the light emitting device 120. The first opening TH1 may be provided to be overlapped with the first bonding portion 121 of the light emitting device 120 in the first direction from the upper surface of the first body 111 toward the lower surface thereof.

For example, a lower surface of the first bonding portion 121 may be disposed to be higher than an upper surface of the first opening TH1. The lower surface of the first bonding portion 121 may be disposed to be higher than the upper surface of the first body 111.

The second opening TH2 may be provided at the first body 111. The second opening TH2 may be provided by passing through the first body 111. The second opening TH2 may be provided by passing through the upper surface and the lower surface of the first body 111 in the first direction.

The second opening TH2 may be provided at the second portion 111b of the first body 111. The second opening TH2 may be provided by passing through the second portion 111b. The second opening TH2 may be provided by passing through the upper surface and the lower surface of the second portion 111b in the first direction.

The second opening TH2 may be disposed under the light emitting device 120. The second opening TH2 may be provided to be overlapped with the second bonding portion 122 of the light emitting device 120. The second opening TH2 may be provided to be overlapped with the second bonding portion 122 of the light emitting device 120 in the first direction from the upper surface of the first body 111 toward the lower surface thereof.

For example, a lower surface of the second bonding portion 122 may be disposed to be higher than an upper surface of the second opening TH2. The lower surface of the second bonding portion 122 may be disposed to be higher than the upper surface of the first body 111.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width of an upper region of the first opening TH1 may be provided to be smaller than that of the lower surface of the first bonding portion 121. In addition, a width of an upper region of the second opening TH2 may be provided to be smaller than that of the lower surface of the second bonding portion 122.

In addition, the width of the upper region of the first opening TH1 may be provided to be smaller than or equal to a width of a lower region of the first opening TH1. Further, the width of the upper region of the second opening TH2 may be provided to be smaller than or equal to a width of a lower region of the second opening TH2.

The first opening TH1 may be provided in an inclined shape in which a width gradually decreases as toward the upper region from the lower region. The second opening TH2 may be provided in an inclined shape in which a width gradually decreases as toward the upper region from the lower region.

However, the present invention is not limited thereto, and an inclined surface between the upper and lower regions of the first and second openings TH1 and TH2 may have a plurality of inclined surfaces having different slopes, and the inclined surface may be disposed to have a curvature.

A width between the first opening TH1 and the second opening TH2 in a lower surface region of the first body 111 may be provided at several hundreds of micrometers. As an example, the width between the first opening TH1 and the second opening TH2 in the lower surface region of the first body 111 may be provided at 100 to 300 micrometers.

The width between the first opening TH1 and the second opening TH2 in the lower surface region of the first body 111 may be selected to be provided over a predetermined distance in order to prevent a short-circuit between bonding pads from occurring when the light emitting device package 100 according to the embodiment is mounted on a circuit board, a submount, or the like later.

The light emitting device package 100 according to the embodiment may include a recess. The light emitting device package 100 may include a plurality of recesses. The plurality of recesses may be provided on the upper surface of the first body 111.

For example, the light emitting device package 100 according to the embodiment may include a first upper recess R10, a second upper recess R20, and a third upper recess R30.

The first upper recess R10 may be provided on the upper surface of the first body 111. The first upper recess R10 may be provided to concave in a direction of the lower surface thereof from the upper surface of the first body 111. The first upper recess R10 may be provided to be spaced apart from the first opening TH1.

The first upper recess R10 may be provided at a periphery of the first opening TH1. The first upper recess R10 may be disposed at a periphery of the first bonding portion 121. The first upper recess R10 may be disposed under the light emitting device 120.

The second upper recess R20 may be provided on the upper surface of the first body 111. The second upper recess R20 may be provided to concave in a direction of the lower surface thereof from the upper surface of the first body 111. The second upper recess R20 may be provided to be spaced apart from the second opening TH2.

The second upper recess R20 may be provided at a periphery of the second opening TH2. The second upper recess R20 may be disposed at a periphery of the second bonding portion 122. The second upper recess R20 may be disposed under the light emitting device 120.

When viewed from an upper direction of the light emitting device package 100 according to the embodiment, the first and second upper recesses R10 and R20 may be disposed to be overlapped with the light emitting device 120. The first upper recess R10 may be disposed to be overlapped on three side surfaces of the first bonding portion 121. In addition, the second upper recess R20 may be disposed to be overlapped on three side surfaces of the second bonding portion 122.

The first upper recess R10 may include a first region extending in a minor axis direction of the light emitting device 120, a second region extending from an end of the first region along a major axis direction of the light emitting device 120, and a third region extending from the other end of the first region along the major axis direction of the light emitting device 120. The second region of the first upper recess R10 and the third region of the first upper recess R10 may be provided in parallel to each other.

The second upper recess R20 may include a first region extending in the minor axis direction of the light emitting device 120, a second region extending from an end of the first region along the major axis direction of the light emitting device 120, and a third region extending from the other end of the first region along the major axis direction of the light emitting device 120. The second region of the second upper recess R20 and the third region of the second upper recess R20 may be provided in parallel to each other.

For example, the first region of the first upper recess R10 and the first region of the second upper recess R20 may be provided in parallel to each other.

According to the embodiment, the second region of the first upper recess R10 may be extended from the first region of the first upper recess R10 along the major axis direction of the light emitting device 120, and may be connected to the second region of the second upper recess R20. The third region of the first upper recess R10 may be extended from the first region of the first upper recess R10 along the major axis direction of the light emitting device 120, and may be connected to the third region of the second upper recess R20.

The third upper recess R30 may be provided between the first upper recess R10 and the second upper recess R20. The third upper recess R30 may be provided between the first and second openings TH1 and TH2. The third upper recess R30 may be provided in connection with the first upper recess R10. The third upper recess R30 may be provided in connection with the second upper recess R20.

When viewed from an upper direction of the light emitting device 120, the third upper recess R30 may be disposed between the first and second bonding portions 121 and 122.

According to another embodiment, the first to third upper recesses R10, R20 and R30 may not be connected to each other but may be disposed to be spaced apart from each other.

A width and depth of the first to third upper recesses R10, R20 and R30 may be provided at several tens of micrometers. As an example, the width and depth of the first to third upper recesses R10, R20 and R30 may be provided at 20 to 40 micrometers.

The cross sections of the first to third upper recesses R10, R20 and R30 may be provided in a polygonal shape. In addition, the cross sections of the first to third upper recesses R10, R20 and R30 may be provided in a curved shape. As an example, the cross sections of the first to third upper recesses R10, R20 and R30 may be provided in a rectangular shape or a triangular shape.

The light emitting device package 100 according to the embodiment may include a first resin 130.

The first resin 130 may be disposed between the light emitting device 120 and the first body 111. The first resin 130 may be disposed between the first bonding portion 121 and the second bonding portion 122. As an example, the first resin 130 may be disposed in contact with a side surface of the first bonding portion 121 and a side surface of the second bonding portion 122.

The first resin 130 may provide a stable fixing force between the light emitting device 120 and the first body 111. The first resin 130 may be disposed in direct contact with the upper surface of the first body 111, as an example. The first resin 130 may be disposed in direct contact with the lower surface of the light emitting device 120.

The first resin 130 may be provided on the entire bottom surface of the cavity provided by the second body 113. The first resin 130 may be disposed on the upper surface of the first body 111 exposed by the second body 113. When viewed from the upper direction of the light emitting device 120, the first resin 130 may be disposed at a periphery of the light emitting device 120.

In addition, the physical properties of the first resin 130 may be selected in consideration of coefficient of thermal expansion (CTE) matching between the first resin 130, the body 110, and the light emitting device 120. The first resin 130 may be selected from resins having a low CTE value. Here, the first resin 130 may be referred to as a low CTE bottom reflector (LCBR), and problems of cracking or peeling due to thermal shock may be improved.

For example, the first resin 130 may be provided as an insulating adhesive. As an example, the first resin 130 may include at least one of an epoxy-based material, a silicone-based material, and a hybrid material including an epoxy-based material and a silicone-based material. Further, as an example, when the first resin 130 includes a reflective function, the adhesive may include a white silicone. The first resin 130 may be referred to as an adhesive.

The first resin 130 may provide a stable fixing force between the first body 111 and the light emitting device 120, and when light is emitted to the lower surface of the light emitting device 120, a light diffusion function may be provided between the light emitting device 120 and the body 110. When light is emitted from the light emitting device 120 to the lower surface of the light emitting device 120, the first resin 130 provides a light diffusion function, thereby improving light extraction efficiency of the light emitting device package 100.

According to the embodiment, the first resin 130 may be provided in a partial region of the body 110 provided with the first and second openings TH1 and TH2. As an example, the first resin 130 may be provided on a partial region of the upper surface of the first body 111 by a method such as coating, dotting, or injection.

The first resin 130 may be provided at the first to third upper recesses R10, R20 and R30. The first resin 130 may be provided at a partial region of the first to third upper recesses R10, R20 and R30.

When the first resin 130 is provided at the first to third upper recesses R10, R20 and R30, an injection region and an injection amount of the first resin 130 may be easily controlled.

Then, the light emitting device 120 may be attached on the first body 111. Accordingly, the first resin 130 may be diffused and moved between the light emitting device 120 and the first body 111. The first resin 130 may be provided to be diffused to a periphery of the first and second bonding portions 121 and 122. The first resin 130 may be disposed in a region between the first and second bonding portions 121 and 122 and the first and second openings TH1 and TH2. In addition, the first resin 130 may be controlled not to move into the first and second openings TH1 and TH2 by using viscosity and surface tension.

In addition, the first resin 130 may be disposed under the light emitting device 120 and may perform a sealing function. The first resin 130 may seal the upper regions of the first and second openings TH1 and TH2. The first resin 130 may seal peripheral regions of the first and second bonding portions 121 and 122. Accordingly, moisture or foreign substances may be prevented from entering a region where the light emitting device 120 is disposed from a region of the first and second openings TH1 and TH2.

The first to third upper recesses R10, R20 and R30 may provide a proper space in which a kind of under-filling process may be performed at a lower portion of the light emitting device 120. The first to third upper recesses R10, R20 and R30 may be provided at a first depth or more so that the first resin 130 may be sufficiently provided between the lower surface of the light emitting device 120 and the upper surface of the first body 111. In addition, the first to third upper recesses R10, R20 and R30 may be provided at a second depth or less to provide a stable strength of the first body 111.

As an example, a depth T1 of the first to third upper recesses R10, R20 and R30 may be provided at several tens of micrometers. The depth T1 of the first to third upper recesses R10, R20 and R30 may be provided at 40 to 60 micrometers.

In addition, the light emitting device package 100 according to the embodiment may include a second resin 140.

The second resin 140 may be provided on the light emitting device 120. The second resin 140 may be disposed on the first body 111. The second resin 140 may be disposed in the cavity C provided by the second body 113.

The second resin 140 may include an insulating material. The second resin 140 may be provided as a clear molding member. For example, the second resin 140 may include a silicone-based or epoxy-based resin.

In addition, the second resin 140 may include a wavelength converting means configured to receive light emitted from the light emitting device 120 and provide wavelength-converted light. As an example, the second resin 140 may include a phosphor, a quantum dot, and the like.

In addition, according to the embodiment, the light emitting structure 123 may be provided as a compound semiconductor. The light emitting structure 123 may be provided as, as an example, a Group II-VI or Group III-V compound semiconductor. For example, the light emitting structure 123 may be provided with at least two or more elements selected from aluminum (Al), gallium (Ga), indium (In), phosphorus (P), arsenic (As), and nitrogen (N).

The light emitting structure 123 may include a first conductive type semiconductor layer, an active layer, and a second conductive type semiconductor layer.

The first and second conductive type semiconductor layers may be implemented as at least one of the Group II-VI or Group III-V compound semiconductors. The first and second conductive type semiconductor layers may be formed of a semiconductor material having an empirical formula of $In_xAl_yGa_{1-x-y}N$ ($0 \leq x \leq 1$, $0 \leq y \leq 1$, $0 \leq x+y \leq 1$). For example, the first and second conductive type semiconductor layers may include at least one selected from the group consisting of GaN, AlN, AlGaN, InGaN, InN, InAlGaN, AlInN, AlGaAs, GaP, GaAs, GaAsP, AlGaInP, and the like. The first conductive type semiconductor layer may be an n-type semiconductor layer doped with an n-type dopant such as Si, Ge, Sn, Se, or Te. The second conductive type semiconductor layer may be a p-type semiconductor layer doped with a p-type dopant such as Mg, Zn, Ca, Sr, or Ba.

The active layer may be implemented as a compound semiconductor. The active layer may be implemented as at least one of the Group III-V or Group II-VI compound semiconductors. When the active layer is implemented as a multi-well structure, the active layer may include a plurality of well layers and a plurality of barrier layers that are alternately disposed, and the active layer may be disposed as the semiconductor material having an empirical formula of $In_xAl_yGa_{1-x-y}N$ ($0 \leq x \leq 1$, $0 \leq y \leq 1$, $0 \leq x+y \leq 1$). For example, the active layer may include at least one selected from the group consisting of InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

The light emitting device package 100 according to the embodiment may be supplied with the first and second openings TH1 and TH2 being empty spaces. In addition, a conductor may be formed in the region of the first and second openings TH1 and TH2 in the process of mounting the light emitting device package 100 on a submount, a main substrate, or the like later.

In the light emitting device package 100 according to the embodiment, considering that a conductor may be provided in the first and second openings TH1 and TH2 later, a thickness of the first body 111 may be selected from several tens of micrometers to several hundreds of micrometers.

For example, in consideration of a strength of the body 110, the thickness of the second portion 111b of the first body 111 may be selected to be 70 micrometers or more. In addition, the thickness of the second portion 111b in which the first and second openings TH1 and TH2 are provided may be selected to be 110 micrometers or less such that the conductors are supplied to the first and second openings TH1 and TH2 and are bonded to the first and second bonding portions 121 and 122.

The light emitting device package 100 according to the embodiment may include a plurality of regions S1, S2, S3, and S4 provided concave from the lower surface of the first body 111 to an upper region thereof as described above. The plurality of regions S1, S2, S3, and S4 may provide a kind of hot air path.

The plurality of regions S1, S2, S3, and S4 may be referred to as a recess provided on the lower surface of the first body 111. The plurality of regions S1, S2, S3, and S4 may provide a kind of lower recess on the lower surface of the first body 111.

The first body 111 may include an upper surface, a lower surface, and a side surface connecting the upper surface and the lower surface. The plurality of regions S1, S2, S3, and S4 may be provided on the lower surface of the first body 111.

The first body 111 may provide the first and second openings TH1 and TH2 passing through the upper surface and the lower surface. The first body 111 may include the recess provided on the lower surface, and the recess may be vertically overlapped with the first and second openings TH1 and TH2, and the recess may be exposed at the side surface of the first body 111.

The plurality of regions S1, S2, S3, and S4 may be connected to each other. As an example, at least two of the plurality of regions S1, S2, S3, and S4 may be provided in connection with each other. The plurality of regions S1, S2, S3, and S4 may be provided around the first and second openings TH1 and TH2.

Each region of the plurality of regions S1, S2, S3, and S4 may provide one lower recess. In addition, a part of the plurality of regions S1, S2, S3, and S4 may be connected to provide another lower recess. Further, still another lower recess connecting a part of the plurality of regions S1, S2, S3, and S4 may be provided.

The recess may include a first lower recess passing through a first side surface and a second side surface. As an example, the recess may include a first lower recess connecting the first region S1 and the third region S3. In addition, the recess may include a second lower recess passing through the first side surface and the second side surface. As an example, the recess may include a second lower recess connecting the first region S1 and the third region S3.

The first lower recess and the second lower recess may be spaced apart from each other on the first side surface and the second side surface. The first lower recess may be disposed to be exposed to the first side surface and the second side surface. In addition, the second lower recess may be disposed to be exposed to the first side surface and the second side surface.

The plurality of regions S1, S2, S3, and S4 may be provided in a direction perpendicular to the direction in which the first and second openings TH1 and TH2 are provided to be passed through. The first and second openings TH1 and TH2 may be provided in the first direction passing through from the upper surface to the lower surface of the first body 111. The plurality of regions S1, S2, S3, and S4 may be provided in a second direction perpendicular to the first direction.

The first and second regions S1 and S2 among the plurality of regions S1, S2, S3, and S4 may be provided perpendicular to a major axis direction of the light emitting device package, and may be disposed to extend to an end of a first long side of the light emitting device package. The third and fourth regions S3 and S4 among the plurality of regions S1, S2, S3, and S4 may be provided perpendicular to the major axis direction of the light emitting device package, and may be disposed to extend to an end of a second long side of the light emitting device package. The first long side and the second long side may be disposed in parallel to each other.

The first long side and the second long side may be disposed on the side surface of the first body 111 and may be disposed to face each other. The first and second openings TH1 and TH2 may be provided between the first long side and the second long side.

For example, the plurality of regions S1, S2, S3, and S4 may be provided to extend to the side surface of the first body 111. The plurality of regions S1, S2, S3, and S4 may be exposed at the side surface of the first body 111.

For example, the first long side may be referred to as a first side surface, and the second long side may be referred to as a second side surface. The first side surface and the second side surface may be provided to face each other. The recess formed by the plurality of regions S1, S2, S3, and S4 may be provided by passing through the first side surface and the second side surface.

In addition, the recess may include at least two exposed portions spaced apart from each other at the first side surface. Further, the recess may include at least two exposed portions spaced apart from each other at the second side surface. As an example, a region in contact with the first and second side surfaces among the plurality of regions S1, S2, S3, and S4 may be referred to as an exposed portion.

In the light emitting device package according to the embodiment, the recess may include a first recess extended in the same direction as a first direction from the first bonding portion 121 of the light emitting device 120 toward the second bonding portion 122 thereof and a second recess extending in a second direction perpendicular to the first direction.

For example, the first recess may be provided around the first and second openings TH1 and TH2 and may be provided in parallel to the first direction from the first bonding portion 121 toward the second bonding portion 122, and may be a concave portion connecting the S1 region and the S2 region. In addition, the second recess may be provided in a second direction perpendicular to the first direction and may be a concave portion disposed between the first and second openings TH1 and TH2. The first recess and the second recess may be provided in connection with each other.

In addition, the first recess may be provided around the first and second openings TH1 and TH2 and may be provided in parallel to the first direction from the first bonding portion 121 toward the second bonding portion 122, and may be a concave portion connecting the S3 region and the S4 region. In addition, the second recess may be provided in a second direction perpendicular to the first direction and may be a concave portion disposed between the first and second openings TH1 and TH2. The first recess and the second recess may be provided in connection with each other.

In the case where a conductor is provided in the first and second openings TH1 and TH2, in order to normally bond the provided conductor to the first and second bonding portions 121 and 122, an appropriate amount of heat that may melt the conductor should be supplied through a reflow process or the like.

However, since the light emitting device package 100 according to the embodiment does not include a conductive frame having excellent thermal conductivity, a hot air path utilizing convection is applied as a method for supplying a sufficient amount of heat to the conductor provided in the first and second openings TH1 and TH2.

According to the embodiment, since a sufficient amount of heat may be supplied to the conductor provided in the first and second openings TH1 and TH2 through the hot air path provided by the plurality of regions S1, S2, S3, and S4, it is possible to prevent occurrence of a bonding failure such as cold soldering between the first and second bonding portions 121 and 122 and the conductor.

Meanwhile, according to a light emitting device package 100 according to another embodiment, the light emitting device package 100 may be supplied in a state in which a conductor is provided to the first and second openings TH1 and TH2.

In the light emitting device package 100 according to the embodiment, power may be connected to the first bonding portion 121 through the conductor provided in the first opening portion TH1, and power may be connected to the second bonding portion 122 through the conductor provided in the second opening portion TH2.

Accordingly, the light emitting device 120 may be driven by the driving power supplied through the first bonding portion 121 and the second bonding portion 122. In addition, the light emitted from the light emitting device 120 may be provided in an upper direction of the body 110.

Meanwhile, the light emitting device package 100 according to the embodiment described above may be supplied to be mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and a light emitting device provided at the light emitting device package, so that stability of electrical connection and physical coupling may be weakened.

However, according to the light emitting device package and a method of manufacturing the light emitting device package according to the embodiment, the first bonding portion 121 and the second bonding portion 122 of the light emitting device 120 according to the embodiment may be provided with driving power by the conductor. In addition, the melting point of the conductor may be selected to have a higher value than that of a general bonding material.

Therefore, even when the light emitting device package 100 according to the embodiment is bonded to a main substrate or the like through the reflow process, since the re-melting phenomenon does not occur, there is an advantage that electrical connection and physical bonding force are not deteriorated.

In addition, according to the light emitting device package 100 and the method of manufacturing the light emitting device package according to the embodiment, a conductive paste may be used as a conductor, and it is not necessary to expose the body 110 to high temperature in the process of manufacturing the light emitting device package. Therefore, according to the embodiment, it is possible to prevent the body 110 from being exposed to high temperature and being damaged or discolored.

Accordingly, the range of selection of materials constituting the body 110 may be widened. According to the embodiment, the body 110 may be provided using a relatively low-cost resin material as well as expensive materials such as ceramics.

For example, the body 110 may include at least one selected from the group consisting of polyphthalamide (PPA), polychloro tri phenyl (PCT), epoxy molding compound (EMC), silicone molding compound (SMC).

Meanwhile, according to the light emitting device package according to the embodiment described above, the body 110 may include only a support member having a flat upper surface, and may be provided so as not to include an inclined reflector.

In other words, according to the light emitting device package according to the embodiment, the body 110 may be provided with a structure providing the cavity C. In addition, the body 110 may be provided with a structure having a flat upper surface without providing the cavity C.

Figure 5:
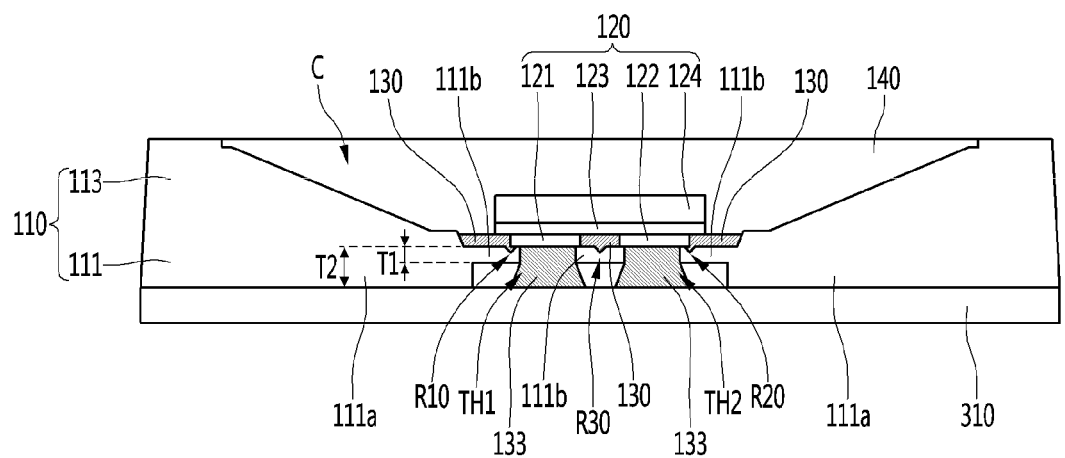
FIG. 5 is a view illustrating another example of a light emitting device package according to an embodiment of the present invention.

Next, another example of a light emitting device package according to the embodiment will be described with reference to FIG. 5. FIG. 5 is a view illustrating another example of a light emitting device package according to an embodiment of the present invention.

In describing the light emitting device package according to the embodiment with reference to FIG. 5, the description of the contents overlapping with the contents described with reference to FIGS. 1 to 4 may be omitted.

A light emitting device package 300 according to the embodiment of the present invention shown in FIG. 5 is an example in which the light emitting device package 100 described with reference to FIGS. 1 to 4 is mounted on a circuit board 310 and supplied.

The light emitting device package 300 according to the embodiment may include the circuit board 310, a body 110, and a light emitting device 120, as shown in FIG. 5.

The circuit board 310 may include a first pad, a second pad, and a substrate. A power supply circuit for controlling driving of the light emitting device 120 may be provided on the substrate.

The body 110 may be disposed on the circuit board 310. A first pad region of the circuit board 310 and the first bonding portion 121 may be electrically connected through a conductor 133. In addition, a second pad region of the circuit board 310 and the second bonding portion 122 may be electrically connected through the conductor 133.

The conductor 133 may be provided as a conductive adhesive, as an example. The conductor 133 may be provided on the first and second pad regions of the circuit board 310. In the process of mounting the body 110 on the circuit board 310, the conductor 133 may be moved into the first and second openings TH1 and TH2 and may be provided in contact with and bonded to the first and second bonding portions 121 and 122. As an example, the conductor 133 may be diffused and moved into the first and second openings TH1 and TH2 by a capillary phenomenon or the like.

For example, the conductor 133 may include at least one material selected from the group consisting of Ag, Au, Pt, Sn, Cu, etc. or an alloy thereof. However, the present invention is not limited thereto, and a material capable of securing a conductive function may be used for the conductor 133.

For example, the conductor 133 may be formed by using a conductive paste. The conductive paste may include a solder paste, a silver paste, or the like, and may be composed of multiple layers composed of different materials or multiple layers or a single layer composed of alloys thereof. As an example, the conductor 133 may include an SAC (Sn—Ag—Cu) material.

The body 110 may include a first body 111 and a second body 113. The second body 113 may be disposed on the first body 111. The second body 113 may be disposed at a periphery of an upper surface of the first body 111. The second body 113 may provide a cavity C on the upper surface of the first body 111.

The first body 111 may include a first portion 111a, a second portion 111b, and a third portion 111c. The first body 111 may include portions having different thicknesses.

For example, the first portion 111a may be provided with a second thickness T2, and the second portion 111b may be provided with a first thickness T1. In addition, the third portion 111c may be provided with a thickness range between the thickness of the first portion 111a and the thickness of the second portion 111b.

The first body 111 may include a stepped region provided by a difference in thickness between the first portion 111a and the second portion 111b. A lower surface of the second portion 111b may be disposed to be higher than a lower surface of the first portion 111a.

According to the embodiment, the light emitting device 120 may include a first bonding portion 121, a second bonding portion 122, a light emitting structure 123, and a substrate 124.

The light emitting device 120 may be disposed on the body 110. The light emitting device 120 may be disposed on the first body 111. The light emitting device 120 may be disposed in the cavity C provided by the second body 113.

The first bonding portion 121 may be disposed on a lower surface of the light emitting device 120. The second bonding portion 122 may be disposed on the lower surface of the light emitting device 120. The first bonding portion 121 and the second bonding portion 122 may be disposed to be spaced apart from each other on the lower surface of the light emitting device 120.

The first bonding portion 121 may be disposed between the light emitting structure 123 and the first body 111. The second bonding portion 122 may be disposed between the light emitting structure 123 and the first body 111.

The light emitting device package 300 according to the embodiment may include a first opening TH1 and a second opening TH2.

The first opening TH1 may be provided at the first body 111. The first opening TH1 may be provided by passing through the first body 111. The first opening TH1 may be provided by passing through the upper surface and a lower surface of the first body 111 in a first direction.

The first opening TH1 may be provided at the second portion 111b of the first body 111. The first opening TH1 may be provided by passing through the second portion 111b. The first opening TH1 may be provided by passing through an upper surface and the lower surface of the second portion 111b in the first direction.

The first opening TH1 may be disposed under the light emitting device 120. The first opening TH1 may be provided to be overlapped with the first bonding portion 121 of the light emitting device 120. The first opening TH1 may be provided to be overlapped with the first bonding portion 121 of the light emitting device 120 in the first direction from the upper surface of the first body 111 toward the lower surface thereof.

For example, a lower surface of the first bonding portion 121 may be disposed to be higher than an upper surface of the first opening TH1. The lower surface of the first bonding portion 121 may be disposed to be higher than the upper surface of the first body 111.

The second opening TH2 may be provided at the first body 111. The second opening TH2 may be provided by passing through the first body 111. The second opening TH2 may be provided by passing through the upper surface and the lower surface of the first body 111 in the first direction.

The second opening TH2 may be provided at the second portion 111b of the first body 111. The second opening TH2 may be provided by passing through the second portion 111b. The second opening TH2 may be provided by passing through the upper surface and the lower surface of the second portion 111b in the first direction.

The second opening TH2 may be disposed under the light emitting device 120. The second opening TH2 may be provided to be overlapped with the second bonding portion 122 of the light emitting device 120. The second opening TH2 may be provided to be overlapped with the second bonding portion 122 of the light emitting device 120 in the first direction from the upper surface of the first body 111 toward the lower surface thereof.

For example, a lower surface of the second bonding portion 122 may be disposed to be higher than an upper surface of the second opening TH2. The lower surface of the second bonding portion 122 may be disposed to be higher than the upper surface of the first body 111.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width of an upper region of the first opening TH1 may be provided to be smaller than that of the lower surface of the first bonding portion 121. In addition, a width of an upper region of the second opening TH2 may be provided to be smaller than that of the lower surface of the second bonding portion 122.

In addition, the width of the upper region of the first opening TH1 may be provided to be smaller than or equal to a width of a lower region of the first opening TH1. Further, the width of the upper region of the second opening TH2 may be provided to be smaller than or equal to a width of a lower region of the second opening TH2.

The first opening TH1 may be provided in an inclined shape in which a width gradually decreases as toward the upper region from the lower region. The second opening TH2 may be provided in an inclined shape in which a width gradually decreases as toward the upper region from the lower region.

However, the present invention is not limited thereto, and an inclined surface between the upper and lower regions of the first and second openings TH1 and TH2 may have a plurality of inclined surfaces having different slopes, and the inclined surface may be disposed to have a curvature.

A width between the first opening TH1 and the second opening TH2 in a lower surface region of the first body 111 may be provided at several hundreds of micrometers. As an example, the width between the first opening TH1 and the second opening TH2 in the lower surface region of the first body 111 may be provided at 100 to 300 micrometers.

The light emitting device package 300 according to the embodiment may include a recess. The light emitting device package 300 may include a plurality of recesses. The plurality of recesses may be provided on the upper surface of the first body 111.

For example, the light emitting device package 300 according to the embodiment may include a first upper recess R10, a second upper recess R20, and a third upper recess R30.

In addition, the light emitting device package 300 according to the embodiment may include a first resin 130.

The first resin 130 may be disposed between the light emitting device 120 and the first body 111. The first resin 130 may be disposed between the first bonding portion 121 and the second bonding portion 122. As an example, the first resin 130 may be disposed in contact with a side surface of the first bonding portion 121 and a side surface of the second bonding portion 122.

The first resin 130 may provide a stable fixing force between the light emitting device 120 and the first body 111. The first resin 130 may be disposed in direct contact with the upper surface of the first body 111, as an example. The first resin 130 may be disposed in direct contact with the lower surface of the light emitting device 120.

According to the embodiment, the first resin 130 may be provided in a partial region of the body 110 provided with the first and second openings TH1 and TH2. As an example, the first resin 130 may be provided on a partial region of the upper surface of the first body 111 by a method such as coating, dotting, or injection.

The first resin 130 may be provided at the first to third upper recesses R10, R20 and R30. The first resin 130 may be provided at a partial region of the first to third upper recesses R10, R20 and R30.

When the first resin 130 is provided at the first to third upper recesses R10, R20 and R30, an injection region and an injection amount of the first resin 130 may be easily controlled.

In addition, the first resin 130 may be disposed under the light emitting device 120 and may perform a sealing function. The first resin 130 may seal the upper regions of the first and second openings TH1 and TH2. The first resin 130 may seal peripheral regions of the first and second bonding portions 121 and 122. Accordingly, moisture or foreign substances may be prevented from entering a region where the light emitting device 120 is disposed from a region of the first and second openings TH1 and TH2.

In addition, the light emitting device package 300 according to the embodiment may include a second resin 140.

The second resin 140 may be provided on the light emitting device 120. The second resin 140 may be disposed on the first body 111. The second resin 140 may be disposed in the cavity C provided by the second body 113.

For example, in consideration of a strength of the body 110, the thickness of the second portion 111b of the first body 111 may be selected to be 70 micrometers or more. In addition, the thickness of the second portion 111b in which the first and second openings TH1 and TH2 are provided may be selected to be 110 micrometers or less such that the conductors 133 are supplied to the first and second openings TH1 and TH2 and are bonded to the first and second bonding portions 121 and 122.

The light emitting device package 300 according to the embodiment may include a plurality of regions S1, S2, S3, and S4 provided concave from the lower surface of the first body 111 to an upper region thereof as described above. The plurality of regions S1, S2, S3, and S4 may provide a kind of hot air path.

The plurality of regions S1, S2, S3, and S4 may be referred to as a recess provided on the lower surface of the first body 111. The plurality of regions S1, S2, S3, and S4 may provide a kind of lower recess on the lower surface of the first body 111.

The first body 111 may include an upper surface, a lower surface, and a side surface connecting the upper surface and the lower surface. The plurality of regions S1, S2, S3, and S4 may be provided on the lower surface of the first body 111.

The first body 111 may provide the first and second openings TH1 and TH2 passing through the upper surface and the lower surface. The first body 111 may include the recess provided on the lower surface, and the recess may be vertically overlapped with the first and second openings TH1 and TH2, and the recess may be exposed at the side surface of the first body 111.

The plurality of regions S1, S2, S3, and S4 may be connected to each other. As an example, at least two of the plurality of regions S1, S2, S3, and S4 may be provided in connection with each other. The plurality of regions S1, S2, S3, and S4 may be provided around the first and second openings TH1 and TH2.

Each region of the plurality of regions S1, S2, S3, and S4 may provide one lower recess. In addition, a part of the plurality of regions S1, S2, S3, and S4 may be connected to provide another lower recess. Further, still another lower recess connecting a part of the plurality of regions S1, S2, S3, and S4 may be provided.

The plurality of regions S1, S2, S3, and S4 may be provided in a direction perpendicular to the direction in which the first and second openings TH1 and TH2 are provided to be passed through. The first and second openings TH1 and TH2 may be provided in the first direction passing through from the upper surface to the lower surface of the first body 111. The plurality of regions S1, S2, S3, and S4 may be provided in a second direction perpendicular to the first direction.

The first and second regions S1 and S2 among the plurality of regions S1, S2, S3, and S4 may be provided perpendicular to a major axis direction of the light emitting device package, and may be disposed to extend to an end of a first long side of the light emitting device package. The third and fourth regions S3 and S4 among the plurality of regions S1, S2, S3, and S4 may be provided perpendicular to the major axis direction of the light emitting device package, and may be disposed to extend to an end of a second long side of the light emitting device package. The first long side and the second long side may be disposed in parallel to each other.

The first long side and the second long side may be disposed on the side surface of the first body 111 and may be disposed to face each other. The first and second openings TH1 and TH2 may be provided between the first long side and the second long side.

For example, the plurality of regions S1, S2, S3, and S4 may be provided to extend to the side surface of the first body 111. The plurality of regions S1, S2, S3, and S4 may be exposed at the side surface of the first body 111.

For example, the first long side may be referred to as a first side surface, and the second long side may be referred to as a second side surface. The first side surface and the second side surface may be provided to face each other. The recess formed by the plurality of regions S1, S2, S3, and S4 may be provided by passing through the first side surface and the second side surface.

In addition, the recess may include at least two exposed portions spaced apart from each other at the first side surface. Further, the recess may include at least two exposed portions spaced apart from each other at the second side surface. As an example, a region in contact with the first and second side surfaces among the plurality of regions S1, S2, S3, and S4 may be referred to as an exposed portion.

In the light emitting device package according to the embodiment, the recess may include a first recess extended in the same direction as a first direction from the first bonding portion 121 of the light emitting device 120 toward the second bonding portion 122 thereof and a second recess extending in a second direction perpendicular to the first direction.

For example, the first recess may be provided around the first and second openings TH1 and TH2 and may be provided in parallel to the first direction from the first bonding portion 121 toward the second bonding portion 122, and may be a concave portion connecting the S1 region and the S2 region. In addition, the second recess may be provided in a second direction perpendicular to the first direction and may be a concave portion disposed between the first and second openings TH1 and TH2. The first recess and the second recess may be provided in connection with each other.

In addition, the first recess may be provided around the first and second openings TH1 and TH2 and may be provided in parallel to the first direction from the first bonding portion 121 toward the second bonding portion 122, and may be a concave portion connecting the S3 region and the S4 region. In addition, the second recess may be provided in a second direction perpendicular to the first direction and may be a concave portion disposed between the first and second openings TH1 and TH2. The first recess and the second recess may be provided in connection with each other.

In the case where the conductors 133 are provided in the first and second openings TH1 and TH2, in order to normally bond the provided conductors 133 to the first and second bonding portions 121 and 122, an appropriate amount of heat that may melt the conductors 133 should be supplied through a reflow process or the like.

However, since the light emitting device package 300 according to the embodiment does not include a conductive frame having excellent thermal conductivity, a hot air path utilizing convection is applied as a method for supplying a sufficient amount of heat to the conductors 133 provided in the first and second openings TH1 and TH2.

A space may be provided between the lower surface of the second portion 111b of the first body 111 and an upper surface of the circuit board 310, and this space may be used as a hot air path.

According to the embodiment, since a sufficient amount of heat may be supplied to the conductors 133 provided in the first and second openings TH1 and TH2 through the hot air path provided by the plurality of regions S1, S2, S3, and S4, it is possible to prevent occurrence of a bonding failure such as cold soldering between the first and second bonding portions 121 and 122 and the conductors 133.

Figure 6:
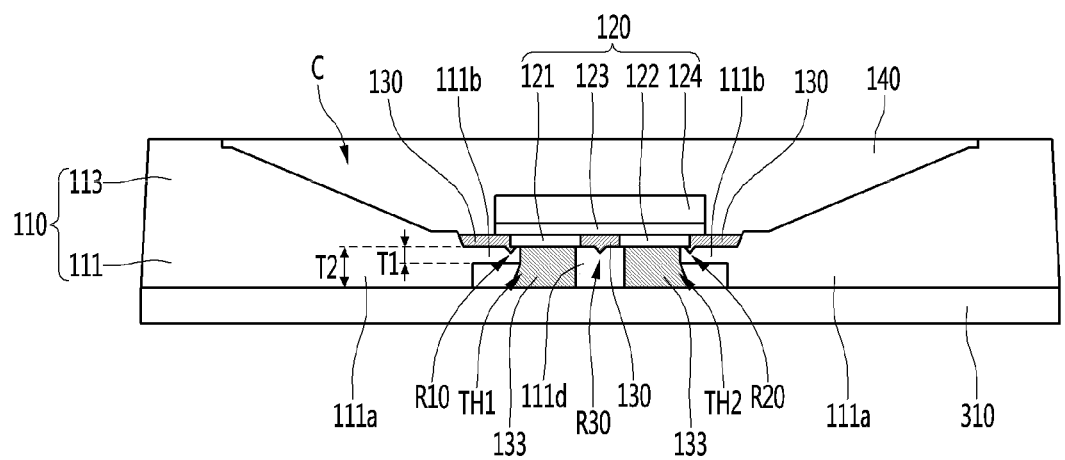
FIG. 6 is a view illustrating still another example of a light emitting device package according to an embodiment of the present invention.

Next, another example of a light emitting device package according to the embodiment will be described with reference to FIG. 6. FIG. 6 is a view illustrating another example of a light emitting device package according to an embodiment of the present invention.

In describing the light emitting device package according to the embodiment with reference to FIG. 6, the description of the contents overlapping with the contents described with reference to FIGS. 1 to 5 may be omitted.

A light emitting device package 400 according to the embodiment of the present invention shown in FIG. 6 is an example in which the package body 110 is mounted on a circuit board 310 and supplied.

The light emitting device package 400 according to the embodiment may include the circuit board 310, a body 110, and a light emitting device 120, as shown in FIG. 6.

The circuit board 310 may include a first pad, a second pad, and a substrate. A power supply circuit for controlling driving of the light emitting device 120 may be provided on the substrate.

The body 110 may be disposed on the circuit board 310. A first pad region of the circuit board 310 and the first bonding portion 121 may be electrically connected through a conductor 133. In addition, a second pad region of the circuit board 310 and the second bonding portion 122 may be electrically connected through the conductor 133.

The conductor 133 may be provided as a conductive adhesive, as an example. The conductor 133 may be provided on the first and second pad regions of the circuit board 310. In the process of mounting the body 110 on the circuit board 310, the conductor 133 may be moved into the first and second openings TH1 and TH2 and may be provided in contact with and bonded to the first and second bonding portions 121 and 122. As an example, the conductor 133 may be diffused and moved into the first and second openings TH1 and TH2 by a capillary phenomenon or the like.

For example, the conductor 133 may include at least one material selected from the group consisting of Ag, Au, Pt, Sn, Cu, etc. or an alloy thereof. However, the present invention is not limited thereto, and a material capable of securing a conductive function may be used for the conductor 133.

For example, the conductor 133 may be formed by using a conductive paste. The conductive paste may include a solder paste, a silver paste, or the like, and may be composed of multiple layers composed of different materials or multiple layers or a single layer composed of alloys thereof. As an example, the conductor 133 may include an SAC (Sn—Ag—Cu) material.

The body 110 may include a first body 111 and a second body 113. The second body 113 may be disposed on the first body 111. The second body 113 may be disposed at a periphery of an upper surface of the first body 111. The second body 113 may provide a cavity C on the upper surface of the first body 111.

The first body 111 may include a first portion 111a, a second portion 111b, a third portion 111c, and a fourth portion 111d. The first body 111 may include portions having different thicknesses.

For example, the first portion 111a may be provided with a second thickness T2, and the second portion 111b may be provided with a first thickness T1. The third portion 111c may be provided with a thickness range between the thickness of the first portion 111a and the thickness of the second portion 111b. The fourth portion 111d may be provided with the same thickness as that of the first portion 111a.

The first body 111 may include a stepped region provided by a difference in thickness between the first portion 111a and the second portion 111b. A lower surface of the second portion 111b may be disposed to be higher than a lower surface of the first portion 111a.

According to the embodiment, the light emitting device 120 may include a first bonding portion 121, a second bonding portion 122, a light emitting structure 123, and a substrate 124.

The light emitting device 120 may be disposed on the body 110. The light emitting device 120 may be disposed on the first body 111. The light emitting device 120 may be disposed in the cavity C provided by the second body 113.

The first bonding portion 121 may be disposed on a lower surface of the light emitting device 120. The second bonding portion 122 may be disposed on the lower surface of the light emitting device 120. The first bonding portion 121 and the second bonding portion 122 may be disposed to be spaced apart from each other on the lower surface of the light emitting device 120.

The first bonding portion 121 may be disposed between the light emitting structure 123 and the first body 111. The second bonding portion 122 may be disposed between the light emitting structure 123 and the first body 111.

The light emitting device package 400 according to the embodiment may include a first opening TH1 and a second opening TH2.

The body 110 may include the first opening TH1 passing through the lower surface of the body 110 from the bottom surface of the cavity C. The body 110 may include the second opening TH2 passing through the lower surface of the body 110 from the bottom surface of the cavity C.

The first opening TH1 may be provided at the first body 111. The first opening TH1 may be provided by passing through the first body 111. The first opening TH1 may be provided by passing through the upper surface and a lower surface of the first body 111 in a first direction.

The first opening TH1 may be provided in the second portion 111b of the first body 111. The first opening TH1 may be provided by passing through the second portion 111b. The first opening TH1 may be provided by passing through the upper surface and the lower surface of the second portion 111b in a first direction. The first opening TH1 may be provided between the second portion 111b and the fourth portion 111d.

The first opening TH1 may be disposed under the light emitting device 120. The first opening TH1 may be provided to be overlapped with the first bonding portion 121 of the light emitting device 120. The first opening TH1 may be provided to be overlapped with the first bonding portion 121 of the light emitting device 120 in the first direction from the upper surface of the first body 111 toward the lower surface thereof.

For example, a lower surface of the first bonding portion 121 may be disposed to be higher than an upper surface of the first opening TH1. The lower surface of the first bonding portion 121 may be disposed to be higher than the upper surface of the first body 111.

The second opening TH2 may be provided at the first body 111. The second opening TH2 may be provided by passing through the first body 111. The second opening TH2 may be provided by passing through the upper surface and the lower surface of the first body 111 in the first direction.

The second opening portion TH2 may be provided at the second portion 111b of the first body 111. The second opening TH2 may be provided by passing through the second portion 111b. The second opening portion TH2 may be provided by passing through the upper surface and the lower surface of the second portion 111b in the first direction. The second opening TH2 may be provided between the second portion 111b and the fourth portion 111d.

The second opening TH2 may be disposed under the light emitting device 120. The second opening TH2 may be provided to be overlapped with the second bonding portion 122 of the light emitting device 120. The second opening TH2 may be provided to be overlapped with the second bonding portion 122 of the light emitting device 120 in the first direction from the upper surface of the first body 111 toward the lower surface thereof.

For example, a lower surface of the second bonding portion 122 may be disposed to be higher than an upper surface of the second opening TH2. The lower surface of the second bonding portion 122 may be disposed to be higher than the upper surface of the first body 111.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width of an upper region of the first opening TH1 may be provided to be smaller than that of the lower surface of the first bonding portion 121. In addition, a width of an upper region of the second opening TH2 may be provided to be smaller than that of the lower surface of the second bonding portion 122.

In addition, the width of the upper region of the first opening TH1 may be provided to be smaller than or equal to a width of a lower region of the first opening TH1. Further, the width of the upper region of the second opening TH2 may be provided to be smaller than or equal to a width of a lower region of the second opening TH2.

A width between the first opening TH1 and the second opening TH2 in a lower surface region of the first body 111 may be provided at several hundreds of micrometers. As an example, the width between the first opening TH1 and the second opening TH2 in the lower surface region of the first body 111 may be provided at 100 to 300 micrometers. A width of a lower surface of the fourth portion 111d may be provided at 100 to 300 micrometers.

The width between the first opening TH1 and the second opening TH2 in the lower surface region of the first body 111 may be selected to be provided over a predetermined distance in order to prevent a short-circuit between bonding pads from occurring when the light emitting device package 400 according to the embodiment is mounted on a circuit board, a submount, or the like later.

The light emitting device package 400 according to the embodiment may include a recess. The light emitting device package 400 may include a plurality of recesses. The plurality of recesses may be provided on the upper surface of the first body 111.

For example, the light emitting device package 400 according to the embodiment may include a first upper recess R10, a second upper recess R20, and a third upper recess R30.

The first upper recess R10 may be provided on the upper surface of the first body 111. The first upper recess R10 may be provided to concave in a direction of the lower surface thereof from the upper surface of the first body 111. The first upper recess R10 may be provided to be spaced apart from the first opening TH1.

The first upper recess R10 may be provided at a periphery of the first opening TH1. The first upper recess R10 may be disposed at a periphery of the first bonding portion 121. The first upper recess R10 may be disposed under the light emitting device 120.

The second upper recess R20 may be provided on the upper surface of the first body 111. The second upper recess R20 may be provided to concave in a direction of the lower surface thereof from the upper surface of the first body 111. The second upper recess R20 may be provided to be spaced apart from the second opening TH2.

The second upper recess R20 may be provided at a periphery of the second opening TH2. The second upper recess R20 may be disposed at a periphery of the second bonding portion 122. The second upper recess R20 may be disposed under the light emitting device 120.

When viewed from an upper direction of the light emitting device package 400 according to the embodiment, the first and second upper recesses R10 and R20 may be disposed to be overlapped with the light emitting device 120. The first upper recess R10 may be disposed to be overlapped on three side surfaces of the first bonding portion 121. In addition, the second upper recess R20 may be disposed to be overlapped on three side surfaces of the second bonding portion 122.

In addition, the light emitting device package 400 according to the embodiment may include a first resin 130.

The first resin 130 may be disposed between the light emitting device 120 and the first body 111. The first resin 130 may be disposed between the first bonding portion 121 and the second bonding portion 122. As an example, the first resin 130 may be disposed in contact with a side surface of the first bonding portion 121 and a side surface of the second bonding portion 122.

The first resin 130 may provide a stable fixing force between the light emitting device 120 and the first body 111. The first resin 130 may be disposed in direct contact with the upper surface of the first body 111, as an example. The first resin 130 may be disposed in direct contact with the lower surface of the light emitting device 120.

The first resin 130 may be provided on the entire bottom surface of the cavity provided by the second body 113. The first resin 130 may be disposed on the upper surface of the first body 111 exposed by the second body 113. When viewed from the upper direction of the light emitting device 120, the first resin 130 may be disposed at a periphery of the light emitting device 120.

In addition, the physical properties of the first resin 130 may be selected in consideration of coefficient of thermal expansion (CTE) matching between the first resin 130, the body 110, and the light emitting device 120. The first resin 130 may be selected from resins having a low CTE value.

Here, the first resin 130 may be referred to as a low CTE bottom reflector (LCBR), and problems of cracking or peeling due to thermal shock may be improved.

For example, the first resin 130 may be provided as an insulating adhesive. As an example, the first resin 130 may include at least one of an epoxy-based material, a silicone-based material, and a hybrid material including an epoxy-based material and a silicone-based material. Further, as an example, when the first resin 130 includes a reflective function, the adhesive may include a white silicone. The first resin 130 may be referred to as an adhesive.

The first resin 130 may provide a stable fixing force between the first body 111 and the light emitting device 120, and when light is emitted to the lower surface of the light emitting device 120, a light diffusion function may be provided between the light emitting device 120 and the body 110. When light is emitted from the light emitting device 120 to the lower surface of the light emitting device 120, the first resin 130 provides a light diffusion function, thereby improving light extraction efficiency of the light emitting device package 100.

According to the embodiment, the first resin 130 may be provided in a partial region of the body 110 provided with the first and second openings TH1 and TH2. As an example, the first resin 130 may be provided on a partial region of the upper surface of the first body 111 by a method such as coating, dotting, or injection.

The first resin 130 may be provided at the first to third upper recesses R10, R20 and R30. The first resin 130 may be provided at a partial region of the first to third upper recesses R10, R20 and R30.

When the first resin 130 is provided at the first to third upper recesses R10, R20 and R30, an injection region and an injection amount of the first resin 130 may be easily controlled.

Then, the light emitting device 120 may be attached on the first body 111. Accordingly, the first resin 130 may be diffused and moved between the light emitting device 120 and the first body 111. The first resin 130 may be provided to be diffused to a periphery of the first and second bonding portions 121 and 122. The first resin 130 may be disposed in a region between the first and second bonding portions 121 and 122 and the first and second openings TH1 and TH2. In addition, the first resin 130 may be controlled not to move into the first and second openings TH1 and TH2 by using viscosity and surface tension.

In addition, the first resin 130 may be disposed under the light emitting device 120 and may perform a sealing function. The first resin 130 may seal the upper regions of the first and second openings TH1 and TH2. The first resin 130 may seal peripheral regions of the first and second bonding portions 121 and 122. Accordingly, moisture or foreign substances may be prevented from entering a region where the light emitting device 120 is disposed from a region of the first and second openings TH1 and TH2.

In addition, the light emitting device package 400 according to the embodiment may include a second resin 140.

The second resin 140 may be provided on the light emitting device 120. The second resin 140 may be disposed on the first body 111. The second resin 140 may be disposed in the cavity C provided by the second body 113.

The second resin 140 may include an insulating material. The second resin 140 may be provided as a clear molding member. For example, the second resin 140 may include a silicone-based or epoxy-based resin.

In addition, the second resin 140 may include a wavelength converting means configured to receive light emitted from the light emitting device 120 and provide wavelength-converted light. As an example, the second resin 140 may include a phosphor, a quantum dot, and the like.

For example, in consideration of a strength of the body 110, the thickness of the second portion 111b of the first body 111 may be selected to be 70 micrometers or more. In addition, the thickness of the second portion 111b in which the first and second openings TH1 and TH2 are provided may be selected to be 110 micrometers or less such that the conductors 113 are supplied to the first and second openings TH1 and TH2 and are bonded to the first and second bonding portions 121 and 122.

The light emitting device package 400 according to the embodiment may include a plurality of regions S1, S2, S3, and S4 provided concave from the lower surface of the first body 111 to an upper region thereof as described above. The plurality of regions S1, S2, S3, and S4 may provide a kind of hot air path.

The plurality of regions S1, S2, S3, and S4 may be referred to as a recess provided on the lower surface of the first body 111. The plurality of regions S1, S2, S3, and S4 may provide a kind of lower recess on the lower surface of the first body 111.

The first body 111 may include an upper surface, a lower surface, and a side surface connecting the upper surface and the lower surface. The plurality of regions S1, S2, S3, and S4 may be provided on the lower surface of the first body 111.

The first body 111 may provide the first and second openings TH1 and TH2 passing through the upper surface and the lower surface. The first body 111 may include the recess provided on the lower surface, and the recess may be vertically overlapped with the first and second openings TH1 and TH2, and the recess may be exposed at the side surface of the first body 111.

The plurality of regions S1, S2, S3, and S4 may be connected to each other. As an example, at least two of the plurality of regions S1, S2, S3, and S4 may be provided in connection with each other. The plurality of regions S1, S2, S3, and S4 may be provided around the first and second openings TH1 and TH2.

Each region of the plurality of regions S1, S2, S3, and S4 may provide one lower recess. In addition, a part of the plurality of regions S1, S2, S3, and S4 may be connected to provide another lower recess. Further, still another lower recess connecting a part of the plurality of regions S1, S2, S3, and S4 may be provided.

The plurality of regions S1, S2, S3, and S4 may be provided in a direction perpendicular to the direction in which the first and second openings TH1 and TH2 are provided to be passed through. The first and second openings TH1 and TH2 may be provided in the first direction passing through from the upper surface to the lower surface of the first body 111. The plurality of regions S1, S2, S3, and S4 may be provided in a second direction perpendicular to the first direction.

The first and second regions S1 and S2 among the plurality of regions S1, S2, S3, and S4 may be provided perpendicular to a major axis direction of the light emitting device package, and may be disposed to extend to an end of a first long side of the light emitting device package. The third and fourth regions S3 and S4 among the plurality of regions S1, S2, S3, and S4 may be provided perpendicular to the major axis direction of the light emitting device package, and may be disposed to extend to an end of a second long side of the light emitting device package. The first long side and the second long side may be disposed in parallel to each other.

The first long side and the second long side may be disposed on the side surface of the first body 111 and may be disposed to face each other. The first and second openings TH1 and TH2 may be provided between the first long side and the second long side.

For example, the plurality of regions S1, S2, S3, and S4 may be provided to extend to the side surface of the first body 111. The plurality of regions S1, S2, S3, and S4 may be exposed at the side surface of the first body 111.

For example, the first long side may be referred to as a first side surface, and the second long side may be referred to as a second side surface. The first side surface and the second side surface may be provided to face each other. The recess formed by the plurality of regions S1, S2, S3, and S4 may be provided by passing through the first side surface and the second side surface.

In addition, the recess may include at least two exposed portions spaced apart from each other at the first side surface. Further, the recess may include at least two exposed portions spaced apart from each other at the second side surface. As an example, a region in contact with the first and second side surfaces among the plurality of regions S1, S2, S3, and S4 may be referred to as an exposed portion.

In the light emitting device package according to the embodiment, the recess may include a first recess extended in the same direction as a first direction from the first bonding portion 121 of the light emitting device 120 toward the second bonding portion 122 thereof and a second recess extending in a second direction perpendicular to the first direction.

For example, the first recess may be provided around the first and second openings TH1 and TH2 and may be provided in parallel to the first direction from the first bonding portion 121 toward the second bonding portion 122, and may be a concave portion connecting the S1 region and the S2 region. In addition, the second recess may be provided in a second direction perpendicular to the first direction and may be a concave portion disposed between the first and second openings TH1 and TH2. The first recess and the second recess may be provided in connection with each other.

In addition, the first recess may be provided around the first and second openings TH1 and TH2 and may be provided in parallel to the first direction from the first bonding portion 121 toward the second bonding portion 122, and may be a concave portion connecting the S3 region and the S4 region. In addition, the second recess may be provided in a second direction perpendicular to the first direction and may be a concave portion disposed between the first and second openings TH1 and TH2. The first recess and the second recess may be provided in connection with each other.

In the case where the conductor 133 is provided in the first and second openings TH1 and TH2, in order to normally bond the conductor 133 to the first and second bonding portions 121 and 122, an appropriate amount of heat that may melt the conductor 133 should be supplied through a reflow process or the like.

However, since the light emitting device package 400 according to the embodiment does not include a conductive frame having excellent thermal conductivity, a hot air path utilizing convection is applied as a method for supplying a sufficient amount of heat to the conductor provided in the first and second openings TH1 and TH2.

A space may be provided between the lower surface of the second portion 111b of the first body 111 and an upper surface of the circuit board 310, and this space may be used as a hot air path.

According to the embodiment, since a sufficient amount of heat may be supplied to the conductors 133 provided in the first and second openings TH1 and TH2 through the hot air path provided by the plurality of regions S1, S2, S3, and S4, it is possible to prevent occurrence of a bonding failure such as cold soldering between the first and second bonding portions 121 and 122 and the conductors 133.

In addition, since the fourth portion 111d having the same thickness as that of the first portion 111a is disposed between the first and second openings TH1 and TH2, it is possible to prevent the conductor 133 provided at the first and second openings TH1 and TH2 from diffusively moving and being electrically connected to each other.

Figure 7:
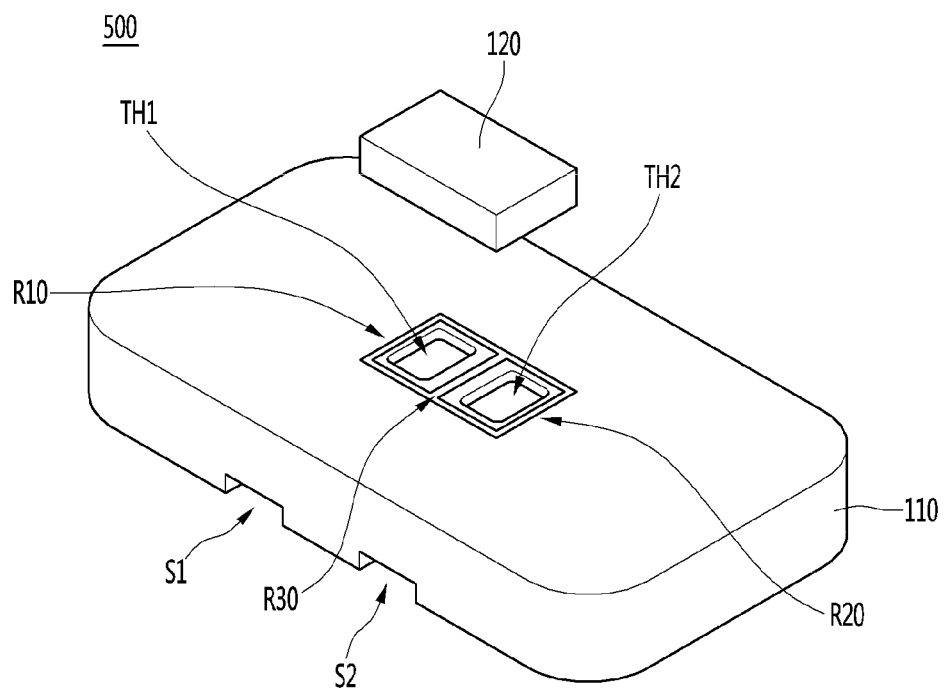
FIG. 7 is a view illustrating yet another example of a light emitting device package according to an embodiment of the present invention.

Next, another example of a light emitting device package according to the embodiment will be described with reference to FIG. 7. FIG. 7 is a view illustrating another example of a light emitting device package according to an embodiment of the present invention.

In describing the light emitting device package according to the embodiment with reference to FIG. 7, the description of the contents overlapping with the contents described with reference to FIGS. 1 to 6 may be omitted.

The light emitting device package according to the embodiment described above may include a body 110 provided with a first opening TH1 and a second opening TH2 as shown in FIG. 7. An upper surface of the body 110 may be provided to flat over the entire area, as an example. The first and second openings TH1 and TH2 may be provided by passing through in a first direction from the upper surface of the body 110 toward a lower surface thereof.

The first and second openings TH1 and TH2 may be provided in a rectangular shape on the upper surface of the body 110, as an example. In addition, the first and second openings TH1 and TH2 may be provided in a rectangular shape on the lower surface of the body 110.

In addition, according to another embodiment, the first and second openings TH1 and TH2 may be provided in a circular shape on the upper surface and the lower surface of the body 110, respectively. Further, the first opening TH1 may be provided as a plurality of openings, and the second opening TH2 may be provided as a plurality of openings.

Meanwhile, a flip chip light emitting device may be provided in the light emitting device package described above, as an example.

As an example, the flip chip light emitting device may be provided as a transmissive type flip chip light emitting device that emits light in six surface directions, or may be provided as a reflective type flip chip light emitting device that emits light in five surface directions.

The reflective type flip chip light emitting device in which light is emitted in the five surface directions may have a structure in which a reflective layer is disposed in a direction close to the package body 110. For example, the reflective type flip chip light emitting device may comprise an insulating reflective layer (for example, a distributed bragg reflector, an omni directional reflector, etc.) and/or a conductive type reflective layer (for example, Ag, Al, Ni, Au, etc.).

Further, the flip chip light emitting device may comprise a first electrode electrically connected to a first conductive type semiconductor layer, and a second electrode electrically connected to a second conductive type semiconductor layer, and may be provided as a general horizontal light emitting device in which light is emitted between the first electrode and the second electrode.

Furthermore, the flip chip light emitting device in which light is emitted in the six surface directions may be provided as a transmissive type flip chip light emitting device comprising a reflective region in which a reflective layer is disposed between the first and second electrode pads and a transmissive region in which light is emitted.

Here, the transmissive type flip chip light emitting device means a device that emits light to six surfaces of an upper surface, four side surfaces, and a lower surface. In addition, the reflective type flip chip light emitting device means a device that emits light to the upper surface and the four side surfaces.

Meanwhile, the light emitting device package according to the embodiment may be applied to the light source apparatus.

Further, the light source apparatus may include a display apparatus, a lighting apparatus, a head lamp, and the like based on the industrial field.

As an example of the light source apparatus, the display apparatus includes a bottom cover, a reflective plate disposed on the bottom cover, a light emitting module emitting light and including a light emitting device, a light guide plate disposed on a front of the reflective plate and guiding light emitted from the light emitting module, an optical sheet including prism sheets disposed in front of the light guide plate, a display panel disposed in front of the optical sheet, an image signal output circuit connected to the display panel and supplying an image signal to the display panel, and a color filter disposed in front of the display panel. Herein, the bottom cover, the reflective plate, the light emitting module, the light guide plate, and the optical sheet may form a backlight unit. In addition, the display apparatus may have a structure in which light emitting devices each emitting red, green, and blue light are disposed without including the color filter.

As another example of the light source apparatus, the head lamp may include a light emitting module including a light emitting device package disposed on a substrate, a reflector for reflecting light emitted from the light emitting module in a predetermined direction, for example, in a forward direction, a lens for forwardly refracting the light, and a shade for blocking or reflecting a portion of the light reflected by the reflector and directed to the lens to form a light distribution pattern desired by a designer.

The lighting apparatus as another light source apparatus may include a cover, a light source module, a heat sink, a power supply, an inner case, and a socket. In addition, the light source apparatus according to an embodiment may further include at least one of a member and a holder. The light source module may include a light emitting device package according to the embodiment.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by anyone having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

What is claimed is:

1. A light emitting device package comprising:
a body including an upper surface, a lower surface, a side surface connecting the upper surface and the lower surface, and first and second openings passing through the upper surface and the lower surface; and
a light emitting device including first and second bonding portions disposed on the first and second openings, respectively,
wherein the body includes a recess provided on the lower surface,
wherein the recess is vertically overlapped with the first opening and the second opening, and
wherein the recess is exposed at the side surface of the body.

2. The light emitting device package of claim 1, wherein the side surface of the body includes a first side surface and a second side surface facing each other, and the recess passes through the first side surface and the second side surface.

3. The light emitting device package of claim 2, wherein the side surface of the body has at least two exposed portions spaced apart from each other at the first side surface.

4. The light emitting device package of claim 1, wherein the recess includes a first recess extending in the same direction as a first direction from the first bonding portion of the light emitting device toward the second bonding portion of the light emitting device and a second recess extending in a second direction perpendicular to the first direction.

5. The light emitting device package of claim 1, wherein the body includes a first portion and a second portion,
wherein the second portion is disposed under the light emitting device to provide the first and second openings, and the first portion is provided around the second portion,
wherein a thickness of the second portion is provided smaller than that of the first portion,
wherein a lower surface of the first portion and a lower surface of the second portion are provided to be stepped to each other, and
wherein the lower surface of the second portion is disposed higher than the lower surface of the first portion.

6. The light emitting device package of claim 5, comprising:
a first resin disposed between the body and the light emitting device; and
an upper recess provided on an upper surface of the second portion,
wherein the first resin is disposed at the upper recess.

7. The light emitting device package of claim 6, wherein the upper recess includes first and second upper recesses, and
wherein the first upper recess is provided around the first opening, and the second upper recess is provided around the second opening.

8. The light emitting device package of claim 7, wherein the upper recess further includes a third upper recess, and wherein the third upper recess is disposed on an upper surface between the first opening and the second opening.

9. The light emitting device package of claim 4, wherein the first and second bonding portions are overlapped with the first and second openings in a third direction, and
wherein the third direction is perpendicular to the first direction and the second direction and is a direction from the lower surface of the body toward the upper surface of the body.

10. The light emitting device package of claim 1, wherein areas of lower surfaces of the first and second bonding portions are provided larger than areas of upper regions of the first and second openings, respectively.

11. The light emitting device package of claim 1, comprising a conductor disposed in the first and second openings and electrically connected to the first and second bonding portions, respectively.

12. The light emitting device package of claim 5, comprising a circuit board disposed under the lower surface of the body,
wherein the lower surface of the second portion of the body is disposed to be spaced apart from an upper surface of the circuit board to provide a space.

13. A light emitting device package, comprising:
a body including an upper surface, a lower surface, and side surfaces connecting the upper surface and the lower surface, and first and second openings passing through the lower surface from the upper surface; and
a light emitting device including a first bonding portion disposed on the first opening and a second bonding portion disposed on the second opening,
wherein the body includes a recess provided on the lower surface,
wherein the recess is provided by passing through a first side surface and a second side surface facing each other among the side surfaces of the body,
wherein the recess is disposed on the lower surface of the body, and includes a plurality of regions disposed to concave in a direction of the upper surface thereof from the lower surface of the body, and
wherein at least two regions among the plurality of regions are provided to be in connection with each other.

14. The light emitting device package of claim 13, wherein the recess includes a first lower recess passing through the first side surface and the second side surface and a second lower recess passing through the first side surface and the second side surface, and
wherein the first lower recess and the second lower recess are disposed to be spaced apart from the first side surface and the second side surface.

15. The light emitting device package of claim 14, wherein the first lower recess is provided to be exposed to the first side surface and the second side surface, and
wherein the second lower recess is disposed to be exposed to the first side surface and the second side surface.

16. The light emitting device package of claim 13, wherein the recess includes a first recess extending in the same direction as a first direction from the first bonding portion of the light emitting device toward the second bonding portion thereof and a second recess extending in a second direction perpendicular to the first direction.

17. The light emitting device package of claim 13, wherein the recess is provided at a periphery of the first and second openings.

18. The light emitting device package of claim 13, comprising a conductor disposed in the first and second openings and electrically connected to the first and second bonding portions, respectively.

19. The light emitting device package of claim 13, comprising a circuit board disposed under the lower surface of the body,
wherein a portion of the lower surface of the body is disposed to be spaced apart from an upper surface of the circuit board.

20. A light emitting device package, comprising:
a body including an upper surface, a lower surface, and side surfaces connecting the upper surface and the lower surface, and first and second openings passing through the lower surface from the upper surface; and
a light emitting device including a first bonding portion disposed on the first opening and a second bonding portion disposed on the second opening,
wherein the body includes a recess provided on the lower surface,
wherein the recess is provided by passing through a first side surface and a second side surface facing each other among the side surfaces of the body, and
wherein the recess is provided at a periphery of the first and second openings.

* * * * *